US008635035B2

(12) United States Patent  
De Oto et al.

(10) Patent No.: US 8,635,035 B2  
(45) Date of Patent: Jan. 21, 2014

(54) SYSTEMS AND METHODS FOR MONITORING OPERATION OF AN LED STRING

(75) Inventors: Len De Oto, Springfield, OH (US); Richard Policy, Urbana, OH (US); Stan Hodge, Hilliard, OH (US)

(73) Assignee: Honeywell International Inc., Morristown, NJ (US)

( * ) Notice: Subject to any disclaimer, the term of this patent is extended or adjusted under 35 U.S.C. 154(b) by 468 days.

(21) Appl. No.: 13/048,461

(22) Filed: Mar. 15, 2011

(65) Prior Publication Data

US 2012/0239326 A1    Sep. 20, 2012

(51) Int. Cl.
*H05B 33/08* (2006.01)
*G01R 31/36* (2006.01)
*G06F 17/40* (2006.01)
*G06F 19/00* (2011.01)

(52) U.S. Cl.
USPC ............ 702/58; 73/865.8; 315/120; 315/129; 324/500; 340/641; 340/642; 702/1; 702/127; 702/182; 702/187; 702/189

(58) Field of Classification Search
USPC ........ 73/432.1, 865.8, 865.9, 866.3; 314/7, 8, 314/9, 10; 315/119, 120, 121, 122, 129, 315/130, 131, 132, 133; 324/72, 73.1, 157, 324/403, 500, 511, 537, 762.01; 340/500, 340/540, 635, 641, 642, 653; 702/1, 33, 34, 702/57, 58, 64, 127, 182, 187, 189; 708/100, 105, 200
IPC ............... G01D 7/00,9/00, 21/00; G01R 19/00, G01R 19/0046, 31/00, 31/26, 31/2607, 31/2632, G01R 31/2635; G06F 11/00, 11/30, 11/32, G06F 11/34, 17/00, 17/40, 19/00; H05B 33/00, H05B H05B 33/02, 33/08, 33/0803, 33/0875, H05B 33/0881, 33/0884, 33/089, 33/0893, H05B 37/00, 37/03, 37/036
See application file for complete search history.

(56) References Cited

U.S. PATENT DOCUMENTS

| | | | |
|---|---|---|---|
| 2,489,649 A * | 11/1949 | Kuever, Jr. ...................... | 315/46 |
| 6,870,325 B2 | 3/2005 | Bushell et al. | |
| 7,075,766 B2 | 7/2006 | Moyer et al. | |
| 7,391,335 B2 | 6/2008 | Mubaslat et al. | |
| 7,429,917 B2 * | 9/2008 | Fredericks et al. ........... | 340/464 |

(Continued)

OTHER PUBLICATIONS

Microsemi; DAZL—Digital Advanced Zone Lighting; microsemi.com; Garden Grove, CA; 2007.

*Primary Examiner* — Edward Cosimano
(74) *Attorney, Agent, or Firm* — Ingrassia Fisher & Lorenz, P.C.

(57) ABSTRACT

Methods and systems for monitoring operation of an LED string. An exemplary system includes an LED string, a circuit that supplies current to the LEDs, a current measuring circuit that measures current through the LEDs, a voltage measuring circuit that measures voltage across the LEDs, and a temperature sensor that measures temperature proximate to the LEDs. A processor calculates a predicted string voltage based on a predefined voltage-current curve, number of LEDs, a predefined temperature coefficient value, the measured string current, a measured junction temperature, a life curve function, a prestored calibration string current value, a prestored calibration string voltage value, a prestored junction calibration temperature and an accumulated time value. The process also calculates an error value based on the predicted string voltage and a measured string voltage and generates an indication that there is a failure in the LED string if the calculated error value is greater than the predefined error limit.

17 Claims, 3 Drawing Sheets

(56) References Cited

U.S. PATENT DOCUMENTS

| | | |
|---|---|---|
| 7,710,253 B1 | 5/2010 | Fredricks |
| 2006/0007012 A1 | 1/2006 | Machi et al. |
| 2006/0082332 A1 | 4/2006 | Ito et al. |
| 2007/0040696 A1* | 2/2007 | Mubaslat et al. ............. 340/657 |
| 2007/0085494 A1 | 4/2007 | Takeda et al. |
| 2007/0195025 A1 | 8/2007 | Korcharz et al. |
| 2007/0200725 A1* | 8/2007 | Fredericks et al. ...... 340/815.45 |
| 2008/0116818 A1 | 5/2008 | Shteynberg et al. |
| 2008/0204029 A1 | 8/2008 | Mihai et al. |
| 2008/0231198 A1 | 9/2008 | Zarr |
| 2010/0117656 A1 | 5/2010 | Snelten |
| 2012/0139544 A1 | 6/2012 | Zimmermann et al. |

* cited by examiner

SYSTEMS AND METHODS FOR MONITORING OPERATION OF AN LED STRING

BACKGROUND OF THE INVENTION

In aviation lighting there are stringent requirements on the amount of light that must be provided to meet minimum safety standards in some installations. In others, there are customer requirements that dictate how much light must be available. It is therefore desirous to know if any and how many light emitting diodes (LEDs) being used in a particular light are functioning properly.

In high power LED general lighting implementations it is very desirous to place the LEDs in a single string so as to reduce the number electronic devices required to provide the proper current to the LEDs. The simplest way to verify that a single LED is functioning properly is to monitor the voltage across the LED when the proper drive current is applied. Complications with this method include several factors. Two well-known factors are the forward voltage of an LED is very sensitive to the junction temperature of the LED die and to the applied drive current. Thus over the temperature extremes that an LED will be exposed to on the outside of an aircraft, a wide range of voltage can be seen. Likewise, the forward voltage will see a wide range based on small changes of applied current. Also, each LED has a potential inherent difference in forward voltage from each other at the same current level. This limits the number of LEDs in a string that can be monitored effectively without additional complexity.

One method of monitoring is to use a relative measurement where points in the LED string are tapped into for voltage measurement and are compared relative to the LED directly adjacent to determine if the LEDs are within the expected voltage range for the applied current. The temperature variation and the normal LED forward voltage variation conspire to limit the number of LEDs that can be sampled to 1 or 2. The disadvantage of this method is the large amount of electrical components needed to monitor a string of more than 4 LEDs.

SUMMARY OF THE INVENTION

The present invention provides an LED light that includes circuitry for determining when a string of LED has had LED failures that take it out of compliance with predefined operational rules.

During factory configuration, LED voltage-current (VI) and temperature curves are loaded into (nonvolatile) memory. During acceptance testing, factory personnel drive the LEDs at a predefined current. Additional information necessary is the number of LEDs and the LED forward voltage vs. life curve. LED string voltage, current, and temperature are continuously measured. The measured data are used to compute compensation values for the errors in the measurement circuitry and differences in individual LED forward voltages.

During normal LED operation, a processor uses the compensation values that were found during factory configuration along with the instantaneous LED current and temperature, the LED VI curve, the LED temperature coefficient, and LED life degradation to calculate the expected/predicted LED string voltage. This expected LED string voltage calculation is compared to the measured LED string voltage to determine if the LED string is operating properly. If the comparison is outside an acceptable threshold, then an LED short is detected. The compensated measurements can also be used to detect open LEDs that have bypass devices.

BRIEF DESCRIPTION OF THE DRAWINGS

Preferred and alternative embodiments of the present invention are described in detail below with reference to the following drawings.

DETAILED DESCRIPTION OF THE INVENTION

Figure 1:
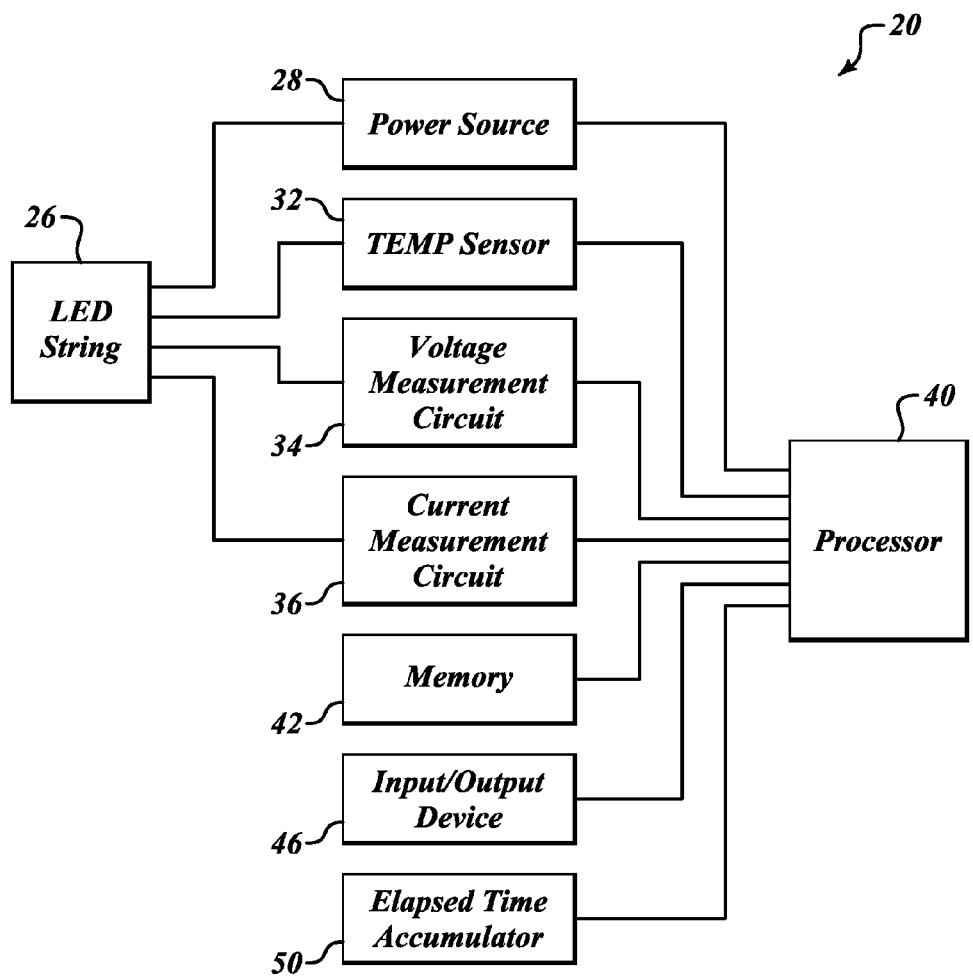
FIG. 1 is a block diagram of an LED string monitoring system formed in accordance with an embodiment of the present invention.

FIG. 1 illustrates an exemplary LED system 20 formed in accordance with an embodiment of the present invention. The system 20 includes an LED string 26, a voltage measuring circuit 34, a current measuring circuit 36, a temperature sensor 32, a power source circuit 28, a processor 40, an input/output device 46 and memory 42. The voltage measuring circuit 34, the current measuring circuit 36, and the power source circuit 28 are electrically connected to the LED string 26. The temperature sensor 32 is located proximate to the LED string 26. The processor 40 is in signal communication with the voltage measuring circuit 34, the current measuring circuit 36, the temperature sensor 32, the power source circuit 28, the input/output device 46, an elapsed time accumulator 50, and the memory 42.

The memory 42 includes various previously stored calibration parameters associated with the LED string 26. During operation of the LED string 26, the processor 40 monitors the values produced by the voltage measuring circuit 34, the current measuring circuit 36, the elapsed time accumulator 50, and the temperature sensor 32. The processor 40 utilizes values received from the sensors 32-36 and calibration parameters stored in the memory 42 to determine if the LED string 26 is functioning properly. If the processor 40 determines that the LED string 26 is not functioning properly (i.e., a threshold number of LEDs in the LED string 26 appear to have failed), then the processor 40 provides some sort of indication to the input/output device 46 or commands the power source circuit 28 to shut off power to the LED string 26.

In one embodiment, the system 20 is implemented on a vehicle, such as an aircraft.

Figure 2:
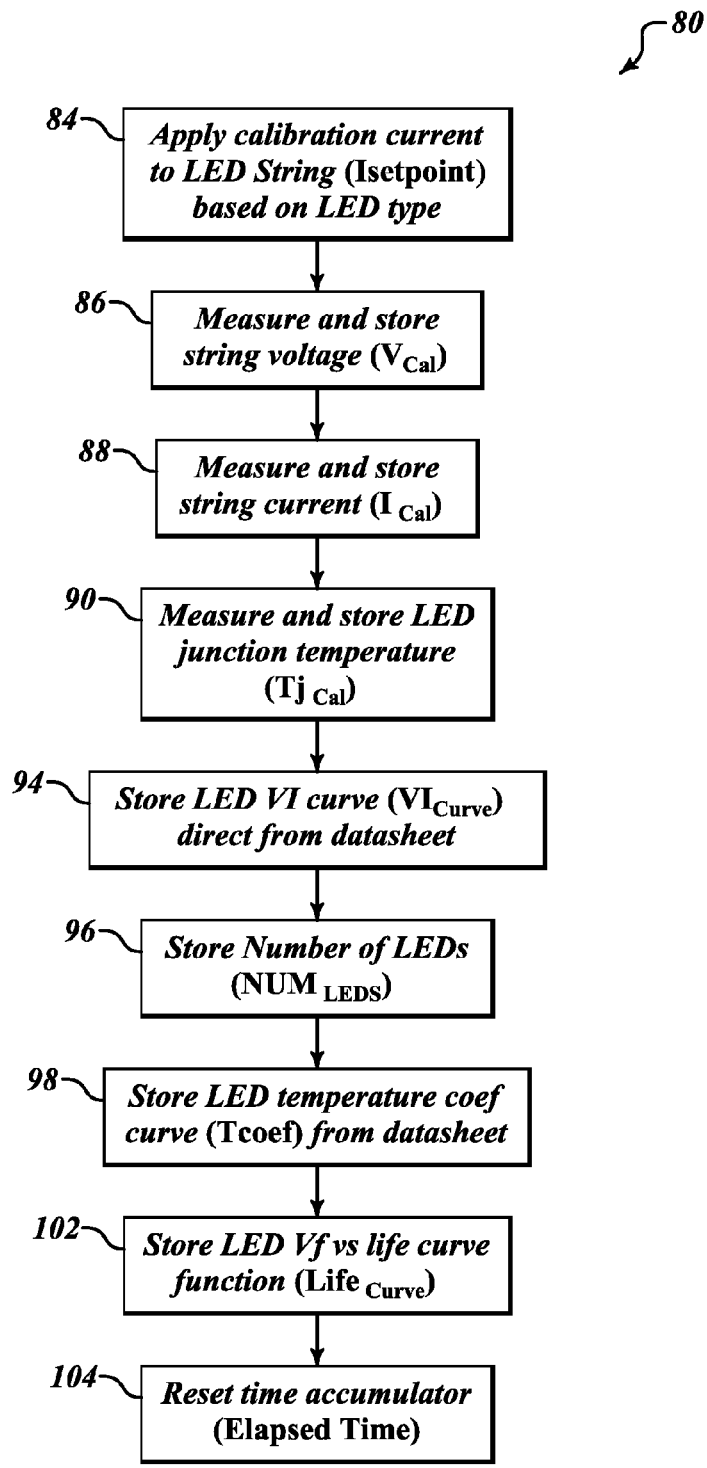
FIG. 2 illustrates a flowchart of an exemplary method for calibrating a recently manufactured LED string.

FIG. 2 illustrates an exemplary process 80 that is performed for a string of LEDs or once for a string of LEDs that are from a particular LED batch having comparable manufacturer parameters. First, at a block 84, an LED string calibration current ($I_{setpoint}$) is applied to the LED string. The selected $I_{setpoint}$ is based on the type of LEDs that are used in the LED string. $I_{setpoint}$ is the current value desired for the LED string and does not need to be particularly accurate for performing the process 80. Next, at a block 86, string voltage ($V_{Cal}$) is measured and saved for later storage in the memory 42. String current ($I_{cal}$) for the LED string is also measured and stored at block 88. LED junction temperature ($Tj_{Cal}$) is determined (preferably from an ambient temperature value based on known junction temperature calculation techniques) and stored at block 90. Next, at a block 94, the VI curve ($VI_{Curve}$) typically provided by the LED manufacturer is stored. At a block 96, the number of LEDs ($NUM_{LEDs}$) that equals the number of LEDs in the LED string is stored. At a block 98, an LED temperature coefficient curve ($T_{coef}$) like the $VI_{Curve}$ is typically retrieved from a manufacturer's datasheet and stored. At a block 102, a graph showing LED forward voltage (Vf) on one axis and a life value on the other axis is stored. This curve is identified as $Life_{Curve}$. All the parameters (blocks 86-102) are stored in the memory 42 of the system 20 and may be saved in the memory of the systems having similar LED strings (e.g., same batch/bin). At a block 104, a time accumulator, or clock, is reset to zero prior to operational use of the LED string.

Figure 3:
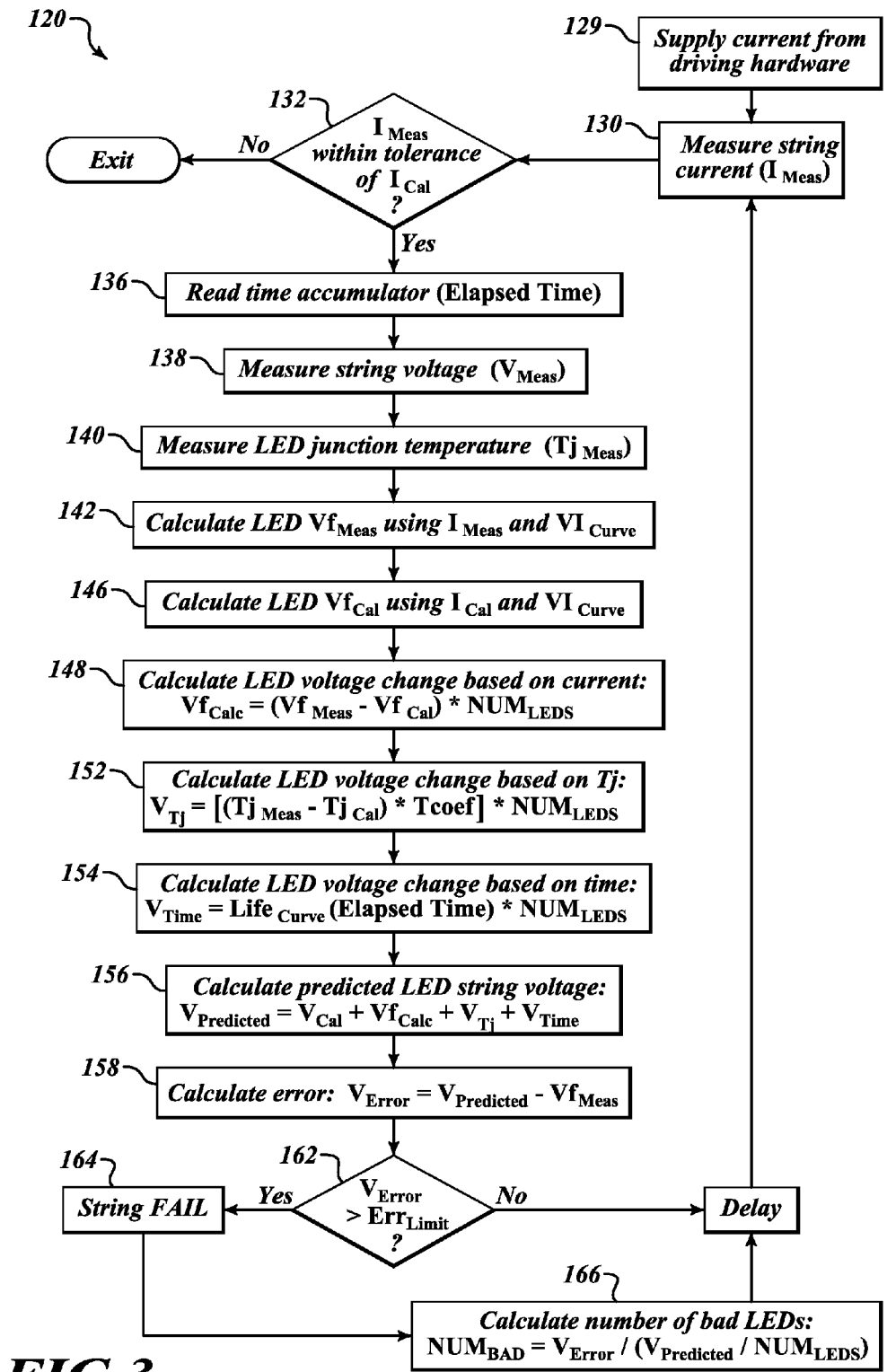
FIG. 3 illustrates a flowchart of an exemplary method for monitoring a calibrated LED string.

FIG. 3 illustrates a health monitoring process 120 performed by the processor 40 during operation of the LED string 26. First, at block 129 current is applied to the LED string prior to running the health monitoring process 120. At this point, the clock starts adding time to the elapsed time accumulator 50. The current level applied is the same as the one during calibration ($I_{setpoint}$). At a block 130, the current measuring circuit 36 measures string current ($I_{Meas}$). The string current measurement may occur at any of a number of places within the LED string 26. At a decision block 132, the processor 40 determines if the string current ($I_{Meas}$) is within a predefined percentage of the stored string current ($I_{Cal}$). If the processor 40 determines that $I_{Meas}$ is not within a predefined percentage, (e.g., 1 to 20 percent) then the processor 40 provides an indication that the LED string is dysfunctional. In one embodiment, if the processor 40 determines that the lighting device is dysfunctional, then the processor 40 provides an indication via the input/output device 46 or deactivates the LED string 26 according to a signal sent to the power source circuit 28. If the string current is determined to be within tolerance, then, at a block 136, the elapsed time value is read from the elapsed time accumulator 50.

Next, at a block 138, a string voltage value ($V_{Meas}$) is measured. Next, at a block 140, LED junction temperature ($T_{jMeas}$) is measured. At a block 142, an LED forward voltage measurement ($Vf_{Meas}$) is calculated using $I_{Meas}$ and the stored $VI_{Curve}$. The calculation of $Vf_{Meas}$ is simply determined by identifying the voltage value from the VI curve using the $I_{Meas}$ value. Next, at a block 146, an LED string forward voltage calibration value ($Vf_{Cal}$) is calculated using the stored $I_{Cal}$ and the stored $VI_{Curve}$. $Vf_{Cal}$ is determined similarly to $Vf_{Meas}$ as performed in block 142. Next, at a block 148, LED string voltage change based on current is calculated according to the following equation:

$$Vf_{Calc} = (Vf_{Meas} - Vf_{Cal}) * NUM_{LEDS}.$$

At a block 152, LED string voltage change based on junction temperature ($T_j$) is calculated according to following equation:

$$V_{Tj} = [(Tj_{Meas} - Tj_{Cal}) * T_{coef}] * NUM_{LEDS}.$$

Next, at a block 154, LED string voltage change based on time is calculated according to the following equation:

$$V_{Time} = Life_{Curve}(\text{elapsed time accumulator}) * NUM_{LEDS}.$$

Then, at a block 156, a predicted LED string voltage is calculated according to the following:

$$V_{Predicted} = V_{Cal} + Vf_{Calc} + V_{Tj} + V_{Time}$$

The full algorithm for $V_{Predicted}$ is as follows:

$$V_{Predicted} = V_{Cal} + [(Vf_{Meas} - Vf_{Cal}) * NUM_{LEDS}] + \{[(Tj_{Meas} - Tj_{Cal}) * T_{coef}] * NUM_{LEDS}\} + [Life_{Curve}(\text{elapsed time accumulator}) * NUM_{LEDS}]$$

At a block 158, the processor 40 calculates an error value of the actual string voltage ($V_{meas}$). The error calculation is performed according to the following equation:

$$V_{Error} = V_{Predicted} - V_{Meas}$$

Next, at a decision block 162, the processor 40 determines if the error value ($V_{Error}$) is greater than a predefined error limit. The error limit may be defined as a percentage of the predicted LED string voltage value. For example, the error limit may be a voltage between 1 and 12 percent of $V_{Predicted}$. If the processor 40 determines that the $V_{error}$ is not greater than the error limit, then the process 120 returns, after a delay, to block 130 to repeat the analysis of the LED string voltage. If, at the decision block 162, the processor 40 determines that the $V_{error}$ is greater than the predefined error limit, then the processor 40 has determined that there is a failure within the LED string 26 and will output some sort of failure indication, see block 164. The indication outputted by the processor at the block 164 may take on a number of different embodiments. In one embodiment, the processor 40 instructs the power source circuit 28 to stop sending power to the LED string 26, thereby deactivating the LED string 26. An LED string 26 that is not illuminated when commanded is a clear indication to, for example, a flight crew, ground-based or cockpit-based, that there is a failure in the light that includes the LED string 26. Other indications may be a message or some illumination within an input/output device 46 that instructs or informs the flight crew that a failure of the LED string 26 has occurred. At a block 166, the processor attempts to calculate the number of LEDs that have failed within the LED string 26. The calculation of the number of bad LEDs is performed according to the following equation:

$$NUM_{BAD} = V_{Error} / (V_{Predicted} / NUM_{LEDS}).$$

The calculated number of bad LEDs is outputted via the input/output device 46 and/or stored for later access.

While the preferred embodiment of the invention has been illustrated and described, as noted above, many changes can be made without departing from the spirit and scope of the invention. For example, some of the calculations presented in FIG. 3 may be left out. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method comprising:
    at a current measuring circuit, measuring current of a string of LEDs;
    at a voltage measuring circuit, measuring voltage of the LED string;
    at a processor:
        a) calculating a predicted LED string voltage based on a previously defined voltage-current (VI) curve, number of LEDs in the LED string, a previously defined temperature coefficient value, the measured LED string current, a measured LED junction temperature, a previously stored calibration string current value, a previously stored calibration string voltage value, and a previously defined LED junction calibration temperature;
        b) calculating an error value based on the predicted LED string voltage and the measured LED string voltage;
        c) determining if the error value is greater than the predefined error limit; and
        d) outputting an indication that there is a failure in the LED string if the calculated error value is greater than the predefined error limit.

2. The method of claim 1, further comprising at the processor:
    determining if the measured LED string current is within a pre-defined error limit; and if the measured LED string current is not within the predefined error limit, then outputting an indication that there is a failure in the LED string prior to performing a)-d).

3. The method of claim 1, wherein outputting comprises deactivating the LED string.

4. The method of claim 1, wherein the calibration string voltage value, the calibration string current value and the LED junction calibration temperature were determined on a test LED string comparable to the LED string using a predefined LED string calibration current.

5. The method of claim 1, wherein calculating a predicted LED string voltage is further based on a life curve function and an accumulated time value, wherein calculating the predicted LED string voltage comprises:
calculating a first voltage value based on the stored calibration string current value and the VI curve;
calculating a second voltage value based on the measured LED string current and the VI curve;
calculating a first LED voltage change by multiplying the difference of the first voltage value and the second voltage value by the number of LEDs;
calculating a second LED voltage change by multiplying the difference of the measured LED junction temperature and the LED junction calibration temperature by the temperature coefficient value and the number of LEDs;
calculating a third LED voltage change by multiplying a value determined from the life curve function based on the accumulated time value by the number of LEDs; and
summing the calibration string voltage, the first LED voltage change, the second LED voltage change, and the third LED voltage change.

6. The method of claim 1, wherein calculating the predicted LED string voltage comprises:
calculating a first voltage value based on the stored calibration string current value and the VI curve;
calculating a second voltage value based on the measured LED string current and the VI curve;
calculating a first LED voltage change by multiplying the difference of the first voltage value and the second voltage value by the number of LEDs;
calculating a second LED voltage change by multiplying the difference of the measured LED junction temperature and the LED junction calibration temperature by the temperature coefficient value and the number of LEDs; and
summing the calibration string voltage, the first LED voltage change, and the second LED voltage change.

7. The method of claim 6, further comprising determining the number of failed LEDs in the LED string.

8. The method of claim 7, wherein determining the number of failed LEDs comprises:
dividing the error value by the quotient of the predicted LED string voltage divided by the number of LEDs.

9. A device comprising:
a string of LEDs;
a circuit configured to supply current to the string of LEDs;
a current measuring circuit configured to measure current through the string of LEDs;
a voltage measuring circuit configured to measure voltage across the string of LEDs;
a temperature sensor configured to measure temperature proximate to the string of LEDs; and
a processor coupled to the circuit, the current measuring circuit, the voltage measuring circuit, a time accumulator circuit, and the temperature sensor, processor configured to:
calculate a predicted LED string voltage based on a previously defined voltage-current (VI) curve, number of LEDs in the LED string, a previously defined temperature coefficient value, the measured LED string current, a measured LED junction temperature, a life curve function, a previously stored calibration string current value, a previously stored calibration string voltage value, a previously defined LED junction calibration temperature and an accumulated time value;
measure voltage of the LED string;
calculate an error value based on the predicted LED string voltage and the measured LED string voltage;
determine if the error value is greater than the predefined error limit; and
generate and output an indication that there is a failure in the LED string if the calculated error value is greater than the predefined error limit.

10. The device of claim 9, wherein the processor is further configured to:
measure current of the LED string;
determine if the measured LED string current is within a pre-defined error limit; and
generate and output an indication that there is a failure in the LED string if the measured LED string current is greater than the predefined error limit prior to performing a)-d).

11. The device of claim 9, wherein the processor generates and outputs an indication by deactivating the LED string.

12. The device of claim 9, wherein the calibration string voltage value, the calibration string current value and the LED junction calibration temperature were determined on a test LED string comparable to the LED string using a predefined LED string calibration current.

13. The device of claim 9, wherein the processor calculates the predicted LED string voltage by:
calculating a first voltage value based on the stored calibration string current value and the VI curve;
calculating a second voltage value based on the measured LED string current and the VI curve;
calculating a first LED voltage change by multiplying the difference of the first voltage value and the second voltage value by the number of LEDs;
calculating a second LED voltage change by multiplying the difference of the measured LED junction temperature and the LED junction calibration temperature by the temperature coefficient value and the number of LEDs;
calculating a third LED voltage change by multiplying a value determined from the life curve function based on the accumulated time value by the number of LEDs; and
summing the calibration string voltage, the first LED voltage change, the second LED voltage change, and the third LED voltage change.

14. The device of claim 13, wherein the processor further determines the number of failed LEDs in the LED string.

15. The device of claim 14, wherein the processor determines the number of failed LEDs by dividing the error value by the quotient of the predicted LED string voltage divided by the number of LEDs.

16. A method comprising:
at a current measuring circuit, measuring current of a string of LEDs;
at a voltage measuring circuit, measuring voltage of the LED string;
at a processor:
calculating a predicted LED string voltage based on a previously defined voltage-current (VI) curve, number of LEDs in the LED string, a previously defined temperature coefficient value, the measured LED string current, a measured LED junction temperature, a previously stored calibration string current value, a previously stored calibration string voltage value, a previously defined LED junction calibration temperature and an accumulated time value;

calculating an error value based on the predicted LED string voltage and the measured LED string voltage;

determining if the error value is greater than the predefined error limit; and outputting an indication that there is a failure in the LED string if the calculated error value is greater than the predefined error limit.

17. The method of claim 16, wherein calculating the predicted LED string voltage comprises:

calculating a first voltage value based on the stored calibration string current value and the VI curve;

calculating a second voltage value based on the measured LED string current and the VI curve;

calculating a first LED voltage change by multiplying the difference of the first voltage value and the second voltage value by the number of LEDs;

calculating a second LED voltage change by multiplying the difference of the measured LED junction temperature and the LED junction calibration temperature by the temperature coefficient value and the number of LEDs; and summing the calibration string voltage, the first LED voltage change, and the second LED voltage change.

* * * * *